(12) United States Patent
Obweger

(10) Patent No.: US 8,974,631 B2
(45) Date of Patent: Mar. 10, 2015

(54) DEVICE FOR FLUID TREATING PLATE-LIKE ARTICLES

(75) Inventor: Rainer Obweger, Lind im Drautal (AT)

(73) Assignee: Lam Research AG, Villach (AT)

( * ) Notice: Subject to any disclaimer, the term of this patent is extended or adjusted under 35 U.S.C. 154(b) by 1248 days.

(21) Appl. No.: 12/281,795

(22) PCT Filed: Feb. 7, 2007

(86) PCT No.: PCT/EP2007/051152
§ 371 (c)(1),
(2), (4) Date: Sep. 5, 2008

(87) PCT Pub. No.: WO2007/101764
PCT Pub. Date: Sep. 13, 2007

(65) Prior Publication Data
US 2009/0079122 A1 Mar. 26, 2009

(30) Foreign Application Priority Data
Mar. 8, 2006 (AT) .................................. A 386/2006

(51) Int. Cl.
*B23Q 1/64* (2006.01)
*H01L 21/687* (2006.01)
*H01L 21/67* (2006.01)

(52) U.S. Cl.
CPC .... *H01L 21/68792* (2013.01); *H01L 21/67051* (2013.01); *H01L 21/67126* (2013.01)
USPC .......................... 156/345.55; 118/730; 269/57

(58) Field of Classification Search
USPC ................. 118/730; 156/345.55, 345; 269/57
See application file for complete search history.

(56) References Cited

U.S. PATENT DOCUMENTS

| 6,273,104 | B1* | 8/2001 | Shinbara et al. | 134/25.4 |
| 6,485,531 | B1 | 11/2002 | Schöb | |
| 6,800,833 | B2* | 10/2004 | Gregor et al. | 219/390 |
| 7,378,618 | B1* | 5/2008 | Sorabji et al. | 219/411 |
| 2001/0006094 | A1 | 7/2001 | Amano et al. | |
| 2001/0014224 | A1* | 8/2001 | Hasebe et al. | 396/579 |
| 2003/0045098 | A1 | 3/2003 | Verhaverbeke et al. | |
| 2005/0028928 | A1 | 2/2005 | Asa | |
| 2006/0108069 | A1* | 5/2006 | Gernert | 156/345.34 |
| 2009/0079122 | A1* | 3/2009 | Obweger | 269/57 |

FOREIGN PATENT DOCUMENTS

| JP | H11513880 A | 11/1999 |
| JP | 2005072559 | 3/2005 |
| WO | 9715978 | 5/1997 |

OTHER PUBLICATIONS

Japanese Office Action, Sep. 29, 2011.

* cited by examiner

*Primary Examiner* — Sylvia R MacArthur
(74) *Attorney, Agent, or Firm* — Young & Thompson

(57) ABSTRACT

A device for fluid treatment of a plate-like article includes a rotary head for holding and rotating a plate-like article around a substantially vertical rotation axis
 drive elements to suspend and drive the rotary head without contact, the elements to suspend and drive the rotary head being arranged radially around the rotary head
 a substantially cylindrical sidewall, which is substantially concentric to the rotation axis, wherein the cylindrical sidewall is arranged between the rotary head and the drive elements and is introduced in the gap between the rotary head and the drive elements
 elevating members for lifting and lowering the rotary head and the wall relative to each other.

16 Claims, 2 Drawing Sheets

DEVICE FOR FLUID TREATING PLATE-LIKE ARTICLES

The invention relates to a device for fluid treating a plate-like article. More particularly the invention refers to a device for fluid treating a plate-like article which comprises a rotary head for holding and rotating a plate-like article around a rotation axis and drive means to suspend and drive the rotary head without contact. Such drive means are arranged radially around the rotary head.

Such plate-like articles can be disc-like articles such as semiconductor wafers, or compact discs as well as polygonal articles such as flat panel displays. The term fluid covers liquid (e.g. for etching, cleaning or rinsing) as well as gas but also other fluids such as supercritical fluids (e.g. supercritical $CO_2$), or two or poly phase systems (e.g. aerosols).

Such drive assemblies and their use in semiconductor industries are known in the art from e.g. U.S. Pat. No. 6,485,531. The drive assembly comprises a rotary head and drive means to suspend and drive the rotary head without contact. Axial as well as radial bearing and the spin speed of the rotary head are controlled by a plurality of circumferentially arranged magnetic coils. Axial bearing may also be carried out by permanent magnets. Such a rotary head, which is driven by drive means to suspend and drive the rotary head without contact, may be called levitating spin chuck.

It is an object of the invention to provide an improved system for treating a plate-like article when being rotated.

The invention meets the object by providing a device for fluid treatment of a plate-like article comprising a rotary head for holding and rotating a plate-like article around a rotation axis, drive means to suspend and drive the rotary head without contact, the drive means being arranged radially around the rotary head, a substantially cylindrical wall, which is substantially concentric to the rotation axis, wherein the cylindrical wall is arranged between the rotary head and the drive means and is introduced in the gap between the rotary head and the drive means, and axial moving means for axially moving the rotary head and the wall along the rotation axis relative to each other.

Such a rotary head is also called spin chuck. The rotary head may hold the plate-like article with a ring, which contacts the plate-like article on its edge. For accelerating and decelerating the plate-like article is merely held by friction. This holding of the plate-like article can be supported by pins or claws, which contact the plate-like article at the edge of the plate-like article. The pins may be movable in order to grip the plate-like article. Such pins may be eccentrically moved through a tooth gear e.g. as described in U.S. Pat. No. 4,903,717. However such a tooth gear may be switched in contactless way through the cylindrical wall by a magnetic switch. In U.S. Pat. No. 5,989,342 eccentric pins are directly switched by magnetic force. Alternative pin movement mechanisms are disclosed e.g. in U.S. Pat. No. 5,788,453 or U.S. Pat. No. 5,845,662. Another way for opening or closing pins is disclosed in EP1067590A2, wherein pins are closed by centrifugal force and opened by gravity. In U.S. Pat. No. 5,375,291 gripping claws are closed when chuck is accelerated or decelerated, wherein said movement is driven by a rotatable mounted inert mass.

An advantage to axially move the levitating spin chuck is to alter the distance of the plate-like article to a member (e.g. plate). Such member may be a plate e.g. for sonic treatment or heating. Another advantage is to lift the spin chuck in an elevated position so that a plate-like article can be easily placed to or picked up from the spin chuck. This makes it possible to treat a plate-like article in a closed chamber with liquid, gas or any other fluid and close the chamber simply with a top cover.

Axial moving means may be selected from the group of hydraulic cylinder, pneumatic cylinder, ball spindle, linear motor, belt drive. Such axial moving means axially move the drive means and therewith indirectly the rotary head. In another embodiment axial moving means are part of the drive means, wherein axial bearing of the rotary head is provided as a sort of linear motor. Thereby a rotary head can be axially moved relative to the cylindrical wall without moving the drive means.

Preferably the gap between rotary head and drive means is in the range of 2-10 mm. A greater gap leads to a poor magnetic interaction between rotor and stator of the magnetic drive assembly.

In one embodiment the cylindrical wall is part of a closable chamber, so that the plate-like article can be treated at a selectable pressure different to ambient pressure. Such pressure different to ambient pressure may be high pressure up to several bar (e.g. 2-10 or even up to 1000 bar if supercritical fluids are to be used) or vacuum (e.g. down to some mPa or less). Preferably the closable chamber comprises an openable cover sealed against the cylindrical wall. Such openable cover gives easy access to the chamber for picking and placing the plate-like article onto the rotary head.

To simplify the construction the means for opening the openable cover may simultaneously serve as axial moving means. In such a case the rotary head and the cover are axially moved together.

In another embodiment means for opening the openable cover and axial moving means are separated from each other. Such separation allows the alteration of the distance from the rotary head to the cover, which might be useful especially if there are functional elements (e.g. ultrasonic transducers, or heating elements, or a plurality of liquid dispensers, or light emitting elements (e.g. UV light)) mounted to the cover in order to treat the plate-like article. This is useful because distance from plate-like article to the cover during fluid treatment might possibly selected smaller than when picking or placing the plate-like article to the rotary head.

In an advantageous embodiment the openable cover is mounted flippable so that each side of the cover can be selected to face the plate-like article when treated. If such a flippable cover is used each side of the cover can be equipped with different functional elements (e.g. ultrasonic transducers or heating elements or a plurality of liquid dispensers or light emitting elements (e.g. UV light)). For instance one side may be equipped with liquid dispensing nozzles and vibrating elements (ultrasonic transducers) whereas the opposite side is equipped with heating elements and a gas source. For instance liquid ultrasonic treatment can be carried out under elevated pressure (e.g. 2 bar) followed by a vacuum gas treatment at elevated temperature (e.g. up to 200-500° C.).

When the side of the plate-like article, which faces the openable cover, shall be treated with a fluid it is preferred that the openable cover is connected to a first media source. The fluid is then dispensed either through a single nozzle or a plurality of nozzles in the openable cover.

In another embodiment a second media supply means is provided to supply media to a second side of the plate-like article. This is advantageous if both sides of the plate-like article are to be treated.

In yet another embodiment axial moving means, wall, rotary head and drive means are arranged to each other so that the rotary head can be moved along the rotation axis so that the plate-like article is moved to a position not within the room surrounded by the cylindrical sidewall. This is helpful for easy access for loading and unloading the plate-like article with transport means (e.g. a robot end effector). This might also be helpful if liquid shall be spun off the plate-like article into an area not within the cylindrical wall. It might be also helpful for a subsequent drying processes (e.g. a combination of Marangoni-drying with spin drying subsequent to a closed chamber processing).

Advantageously the device comprises a first plate substantially parallel to the plate-like article and facing said plate-like article when treated. Said plate may be part of the cover or may be opposite the cover and thus facing the side of the plate-like article, which is not facing the cover. With axial moving means the plate-like article can be brought close to the plate and the distance d1 between plate-like article and plate can be selected from some centimeters (e.g. 5 cm) to 0.1 mm or even 0 mm to contact the plate-like article. A specific distance d1 can be selected e.g. to have an optimum ultrasonic performance in the case when the first plate is equipped with ultrasonic transducers.

If the first plate is part of a bottom member it thereby forms a cup together with the cylindrical wall. When cup is filled with liquid the rotary head and the plate-like article may be fully immersed. This leads to a possible combination of single wafer technology with immersion technology. Such a cup can be used with or without an openable cover.

Advantageously the first plate is acoustically coupled to a vibrating element wherein the first plate may be part of the cover or may be opposite the cover and thus facing the side of the plate-like article, which is not facing the cover.

In addition to the first plate a second plate can be provided, wherein the second plate is substantially parallel to the plate-like article however opposite the first plate with respect to a plate-like article when treated. Thus two plates can be arranged adjacent to the plate-like article for treating simultaneously or alternatively both sides of the plate-like article.

Each thinkable combination of the above-mentioned embodiments of the device as well as of the method is considered to be covered by the scope of the invention.

Further details and advantages of the invention can be realized from the detailed description of a preferred embodiment.

Figure 1:
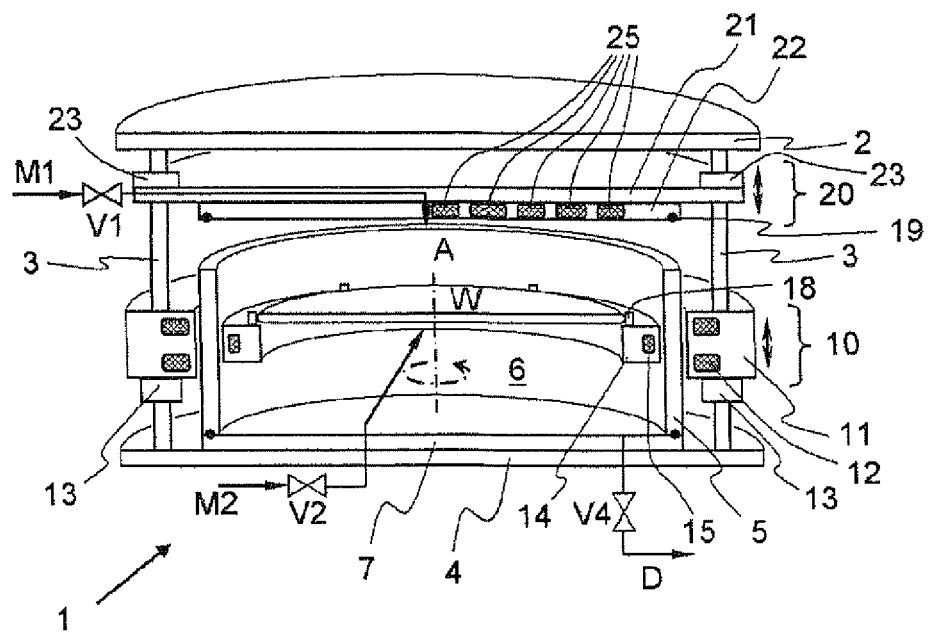
FIG. 1 shows a schematic cross sectional view of a first embodiment of the invention in an open state.

FIG. 1 shows a schematic cross sectional view of a first embodiment of the device 1 for fluid treatment of a plate-like article W according to the invention in an open state. A lower frame plate 4 is connected to the upper frame plate 2 by ball spindles 3. The ball spindles 3 are frame parts on the one hand and are part of the axial moving means on the other hand. Additional frame parts (not shown) may be provided in order to enhance stability.

On the upper part of the lower frame plate 4 the bottom plate 7 of the chamber is attached parallel to the lower frame plate 4. A cylindrical side wall 5 is attached to the bottom plate 7 with its rotational axis A substantially parallel to the ball spindles 3. The cylindrical side wall 5 is pressure-tight connected to the bottom plate, which can be achieved e.g. by welding the parts together or by screwing or clamping the side wall 5 to the bottom plate 7 and sealing with an O-ring. Alternatively the cylindrical side wall 5 and the bottom plate 7 can be made from one piece.

A chuck unit 10 is axially moveably attached to the ball spindles 3. The chuck unit 10 comprises a stator 11, which has merely the form of a ring surrounding the cylindrical sidewall 5, and a levitating rotary head 14. The stator 11 comprises a plurality of electromagnetic coils 12 for driving and for axial and radial bearing of the spin chuck. Alternatively permanent magnets can be used for axial bearing. The rotary head 14 is ring shaped with a plurality of permanent magnets 15 circumferentially arranged at the rotary head's outer periphery. Inner diameter of the stator 11 and outer diameter of the rotary head 14 are selected so that the gap g1 between rotor and stator is in the range of 2-5 mm. As there shall be air gaps between the sidewall and the rotor and between the sidewall and the stator. The thickness of the sidewall is somewhat smaller then the gap g1 (e.g. 1.5-4.5 mm). Such a drive assembly comprising a levitation rotor is called bearing-free disc motor or motor with magnetic bearing, details of which can be learned from U.S. Pat. No. 6,355,998, U.S. Pat. No. 6,249,067 or U.S. Pat. No. 6,222,290.

The stator 11 is axially driven along the ball spindles 3 with ball spindle drives 13. When lifting the stator 11 the rotary head 14 and therewith the plate-like article W is lifted against the cylindrical sidewall 5, whereby neither the rotary head 14 nor the stator 11 touches the cylindrical sidewall 5.

The rotary head 14 comprises gripping pins 18 for holding the plate-like article (wafer W). Such gripping pins may be fixed, tiltable or eccentrically movable as described above.

The cover unit 20 is located between the upper edge of the cylindrical side wall 5 and the upper frame plate 2 substantially perpendicular to the rotation axis A of the cylindrical sidewall 5. The cover unit 20 comprises a frame for the cover 21 and a cover plate 22. The cover unit 20 is axially movable connected to the ball spindles 3 through the ball spindle drives 23. The ball spindle drive 23 thus may vertically move the cover unit 20 along the ball spindles 3. When the cover unit 20 is moved downward it is sealed against the upper edge of the cylindrical side wall 5 by the O-ring seal 19, which is located in an annular groove in the cover plate.

A plurality of ultrasonic transducers 25 are arranged in the upper cover plate 22. However, such ultrasonic transducers may also be attached on the outside of the cover plate acoustically connected thereto. The plurality of ultrasonic transducers 25 merely covers a radius of the plate-like article or a sector of the plate-like article. Therefore in a time sequence of one revolution of the plate-like article the whole surface of the plate-like article is treated by the ultrasonic transducers.

A first medium supply M1 supplies a first medium to the chamber 6. Medium supply M1 is connected with a central medium supply nozzle (indicated by an arrow) in the cover plate 22 for supplying fluid onto the surface of a plate-like article, which faces the cover plate. Medium supply M1 is switched by valve V1. Alternatively a valve cascade may be provided in order to quickly switch between several different media without mixing such media with each other. Such media may be e.g. liquids, gases or other fluids. Thus a liquid supply step may be quickly followed by a drying step, wherein gas is supplied and again followed by a liquid supply step.

A second medium supply M2 is in fluid communication with chamber 6. Medium supply M2 is connected with a medium supply nozzle (indicated by an arrow) in the bottom plate 7 for supplying fluid onto the surface of a plate-like article, which faces the bottom plate. Consequently both sides of a plate-like article may be simultaneously or alternatively treated with the same or with different liquids. If the two sides of the plate-like article are alternatively treated with different liquids or both sides are simultaneously treated with the same liquid the liquids can be collected without mixing and thus may be reused. When different liquids are simultaneously used on each side they are mixed and therefore may not be reused. Medium supply M2 is switched by valve V2.

Fluids are discharged through drain D, which is switched by valve V4. However, fluids may also be discharged through media supplies M1 or M2 by applying vacuum to the respective supply pipe.

Figure 2:
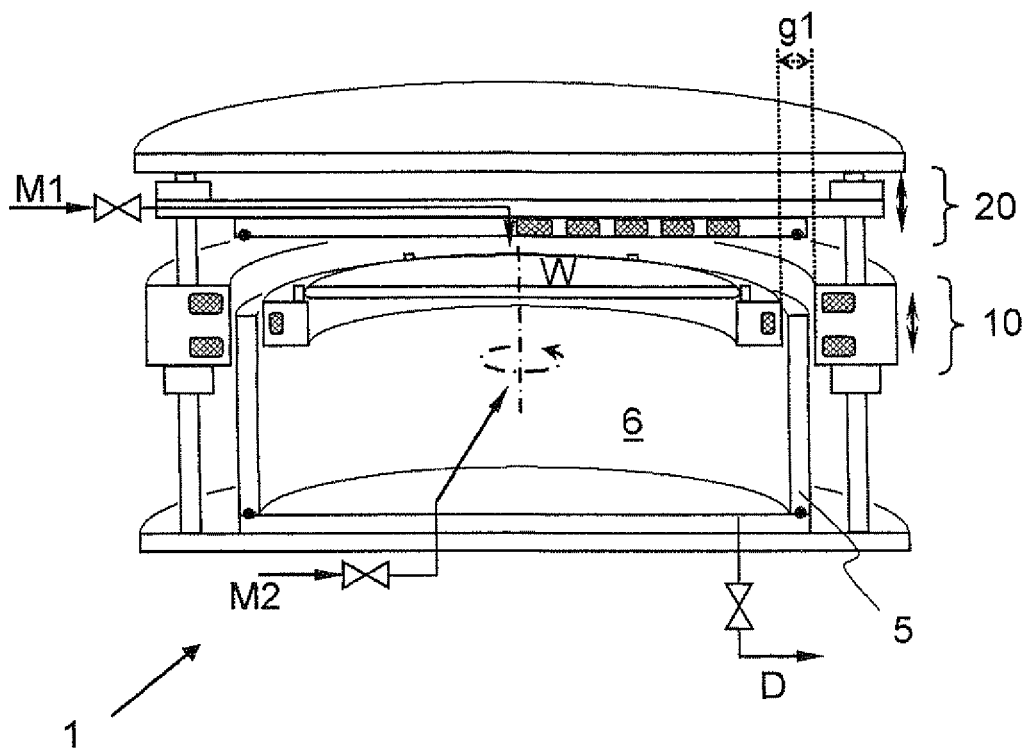
FIG. 2 shows a schematic cross section of a first embodiment of the invention in an open state for loading a plate-like article.
Figure 3:
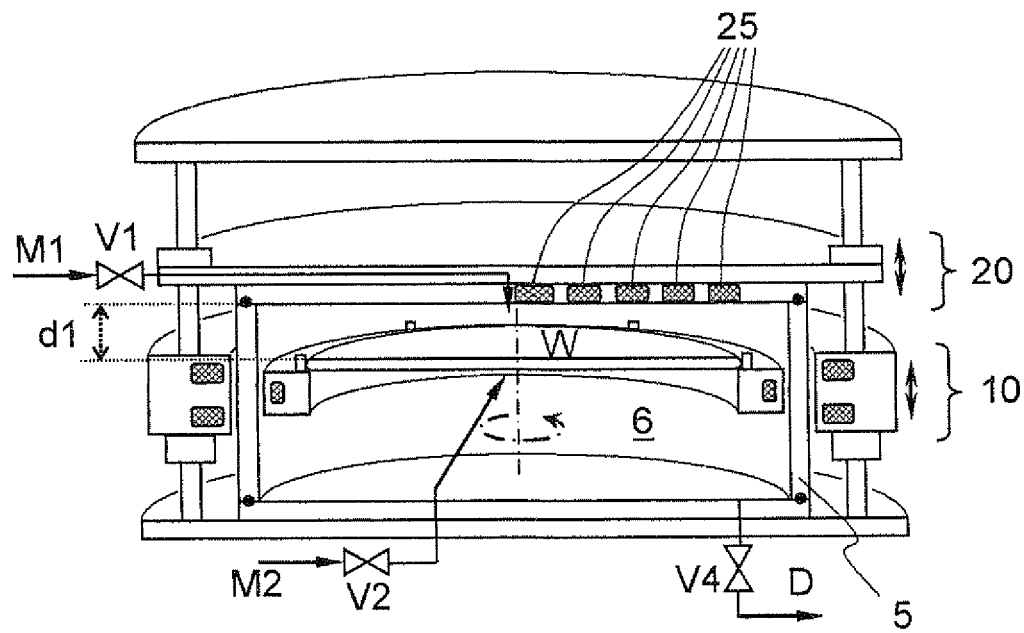
FIG. 3 shows a schematic cross sectional view of a first embodiment of the invention in an open state.

With reference to FIG. 1-3 the device is described in operation. The cover unit 20 is lifted to open the chamber. Simultaneously the chuck unit 10 is lifted as shown in FIG. 2 so that the rotor is easy accessible by a robot end-effector (not shown, e.g. a fork, wafer gripper). The plate-like article W is placed onto the rotary head 14. Thereafter the rotary head is lowered to working position, the cover is closed (FIG. 3) and a treatment process is started.

During processing cleaning liquid is dispensed on both surfaces of the plate-like article through media supply M1 and M2 liquid is drained through drain D. For ultrasonic treatment (e.g. 1.5 MHz) the distance d1 between the plate-like article and the cover plate, which includes the ultrasonic transducers 25, is reduced e.g. to 1 mm. The distance d1 can be periodically altered (e.g. between 0.5 and 1.5). Furthermore pressure may be applied (e.g. 1.5 bar, which is about 0.5 bar above atmospheric pressure) and eventually pressure is periodically altered (e.g. with a frequency of 10 Hz +/−0.2 bar). Alternatively such periodically altered pressure can be used below 1 bar or around 1 bar (thus periodically switching from elevated pressure to vacuum). After a further rinsing step with DI-water liquid is displaced either directly with gas (e.g. IPA/$N_2$) or by a second rinsing liquid (e.g. 2-propanol). Such second rinsing liquid is thereafter displaced by gas (e.g. $N_2$). Additionally drying can be supported by evacuation of the chamber. After purging the chamber with an inert gas the chamber is opened and the plate-like article picked from the rotary head.

Figure 4:
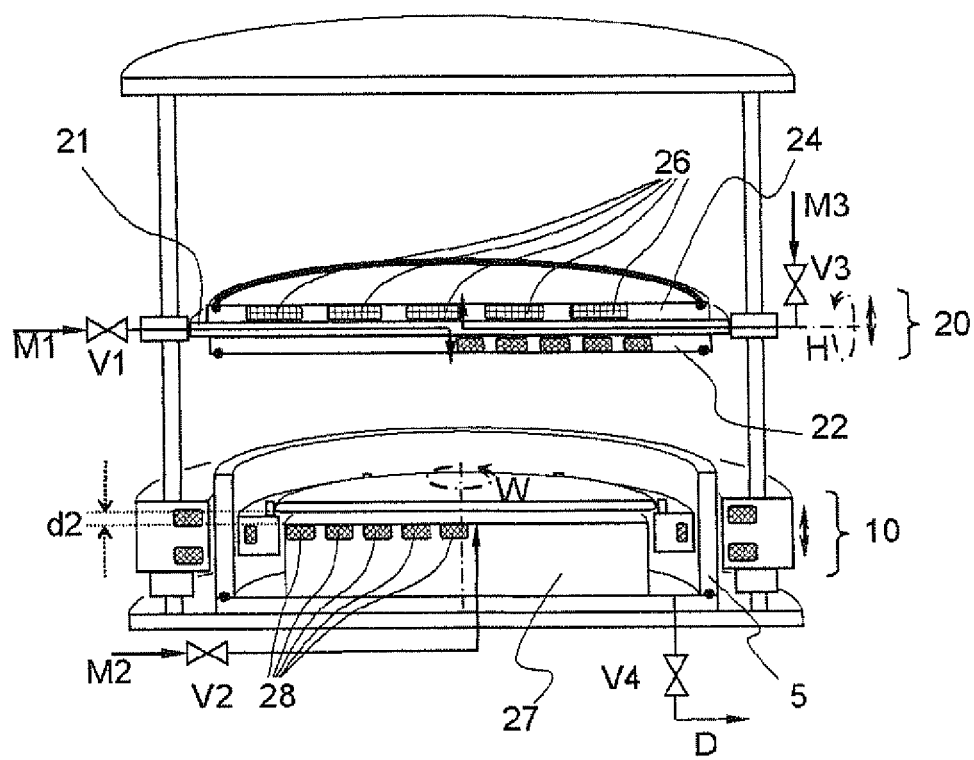
FIG. 4 shows a schematic cross sectional view of a second embodiment of the invention in an open state.

FIG. 4 shows a second embodiment of the invention. This second embodiment comprises two additional features, which however may be applied separately.

The first additional feature is a flippable frame for the cover 21, which can be flipped around a horizontal axis H. Beside the first cover plate 22 a second cover plate 24 is attached to the frame for the cover 21. Heating elements 26 are elements of the second cover plate and a media source M3 is in fluid communication with a central nozzle. Alternatively either cover plate 22 or 24 may be used. Such a flippable frame for the cover may not only be used for the top cover but also for a bottom cover or for both the top and the bottom cover.

The second additional feature shown in FIG. 4 is a central bottom plate 27, which is selected in shape and size so as to be brought in close proximity to the plate-like article. The distance d2 may be 0.5-2 mm. The bottom plate 27 is equipped with ultrasonic transducers 28. Additionally or alternatively heating elements may be provided.

The invention claimed is:

1. A device for fluid treatment of a plate-like article comprising:
    a rotary head for holding and rotating a plate-like article around a rotation axis;
    drive means to suspend and drive the rotary head without contact, the drive means being arranged radially around the rotary head;
    a first media supply means to supply media to a first side of the plate-like article;
    a substantially cylindrical wall, which is substantially concentric to the rotation axis, wherein the substantially cylindrical wall is arranged between the rotary head and the drive means and is introduced in the gap between the rotary head and the drive means, wherein the substantially cylindrical wall is part of a closable chamber, so that the plate-like article can be treated at a selectable pressure different to ambient pressure; and
    axial moving means for axially moving the rotary head and the substantially cylindrical wall along the rotation axis relative to each other,
    wherein the closable chamber comprises an openable cover sealed against one end of the substantially cylindrical wall for picking and placing the plate-like article onto the rotary head, wherein the axial moving means, the substantially cylindrical wall, rotary head and drive means are arranged relative to each other so that the rotary head can be moved along the rotation axis so that the plate-like article is moved to a position not within the space surrounded by the substantially cylindrical wall and where the plate-like article is accessible for removal from the rotary head.

2. The device according to claim 1, wherein the axial moving means are selected from the group of hydraulic cylinder, pneumatic cylinder, ball spindle, linear motor, belt drive.

3. The device according to claim 1, wherein the gap between rotary head and drive means is in the range of 2-10 mm.

4. The device according to claim 1, wherein means for opening the openable cover are simultaneously axial moving means.

5. The device according to claim 1, wherein means for opening the openable cover and axial moving means are separated from each other.

6. The device according to claim 1, wherein the openable cover is flippable mounted so that each side of the cover can be selected to face the plate-like article when treated.

7. The device according to claim 1, wherein the openable cover is connected to a first media source.

8. The device according to claim 1, with second media supply means to supply media to a second side of the plate-like article.

9. The device according to claim 1, with a first plate substantially parallel to the plate-like article and facing said plate-like article when treated.

10. The device according to claim 9, wherein the first plate is part of a bottom member thereby forming a cup together with the wall.

11. The device according to claim 9, wherein the first plate is acoustically coupled to vibrating element.

12. The device according to claim 9, with a second plate substantially parallel to the plate-like article.

13. The device according to claim 1, wherein the openable cover is oriented substantially horizontally and sealingly engages a top end of the substantially cylindrical wall.

14. The device according to claim 1, wherein the openable cover sealingly engages a top end of the substantially cylindrical wall, and is axially displaceable relative to the substantially cylindrical wall.

15. The device according to claim 1, wherein the openable cover is axially displaceable relative to the substantially cylindrical wall along vertically extending supports positioned outside the closeable chamber.

16. The device according to claim 15, wherein the axial moving means are carried by said vertically extending supports.

* * * * *